(12) United States Patent
Nakajima (10) Patent No.: US 6,194,311 B1
(45) Date of Patent: Feb. 27, 2001

(54) METHOD FOR MANUFACTURING SEMICONDUCTOR DEVICE CAPABLE OF EFFECTIVELY CARRYING OUT HYDROGEN PASSIVATION

(75) Inventor: Ryuji Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/325,728

(22) Filed: Jun. 4, 1999

(30) Foreign Application Priority Data

Jun. 26, 1998 (JP) .................................................. 10-181054

(51) Int. Cl.[7] .................................................. H01L 21/336
(52) U.S. Cl. .......................... 438/660; 438/657; 438/795; 438/475; 438/909
(58) Field of Search .................................... 438/660, 657, 438/798, 289, 475, 795, 3, 620, 210, 240, 296, 253, 477, 909, 162; 427/79, 81; 428/688, 425.5, 404, 411.1; 257/295, 310, 303; 148/DIG. 14, DIG. 128, DIG. 24, DIG. 3, DIG. 53

(56) References Cited

U.S. PATENT DOCUMENTS

| | | | |
|---|---|---|---|
| 4,151,007 | * | 4/1979 | Levinstein et al. .................. 438/657 |
| 5,554,559 | * | 9/1996 | Wolters et al. ......................... 438/3 |
| 5,591,663 | * | 1/1997 | Nasu et al. ............................. 438/3 |
| 5,629,043 | * | 5/1997 | Inaba et al. ........................... 427/79 |
| 5,691,229 | * | 11/1997 | Okamura et al. ..................... 438/253 |
| 5,716,875 | * | 2/1998 | Jones, Jr. et al. ....................... 438/3 |
| 5,830,575 | * | 11/1998 | Warren et al. ........................ 428/404 |
| 5,972,765 | * | 10/1999 | Clark et al. .......................... 438/308 |
| 6,015,987 | * | 1/2000 | Arita et al. ........................... 257/303 |

FOREIGN PATENT DOCUMENTS

| | | |
|---|---|---|
| 62-174947 | 7/1987 | (JP) . |
| 1-276742 | 11/1989 | (JP) . |
| 4-62974 | 2/1992 | (JP) . |

* cited by examiner

Primary Examiner—Matthew Smith
Assistant Examiner—Igwe U. Anya
(74) Attorney, Agent, or Firm—McGinn & Gibb, PLLC (57) ABSTRACT

In a method for manufacturing a semiconductor device, a first insulating layer is formed on a semiconductor substrate, and a gate electrode is formed on the first insulating layer. Then, a second insulating layer is formed over the gate electrode. The second insulating layer has a high ability to stop the diffusion of hydrogen atoms therethrough. Then, hydrogen passivation is performed upon an interface between the semiconductor substrate and the first insulating layer at a first temperature. Then, a metal wiring layer is formed over the insulating layer, and the metal wiring layer is heated at a second temperature lower than the first temperature.

10 Claims, 9 Drawing Sheets

METHOD FOR MANUFACTURING SEMICONDUCTOR DEVICE CAPABLE OF EFFECTIVELY CARRYING OUT HYDROGEN PASSIVATION

BACKGROUND OF THE INVENTION

1. Field of the Invention

The present invention relates to a method for manufacturing a semiconductor device such as a dynamic random access memory (DRAM) device using hydrogen passivation.

2. Description of the Related Art

In a prior art method for manufacturing a DRAM device of a one-transistor, one-capacitor type, a gate insulating layer is formed on a semiconductor substrate a gate electrode is formed on the gate insulating layer, and an insulating layer is formed on the gate electrode, thus completing a cell transistor.

Next, a capacitor lower electrode, a capacitor dielectric layer, a capacitor upper electrode and an insulating layer are formed, thus completing a cell capacitor.

Further, a first metal wiring layer and its insulating layer are formed, and then, a second metal wiring layer and its passivation layer are formed.

Finally, a hydrogen passivation, which is also called a hydrogen annealing process, is carried out. Thus, hydrogen atoms diffuse and reach the channel region of the cell transistor, so that unsaturated silicon atoms react with hydrogen atoms. As a result, the drain current-to-gate voltage characteristics are improved. That is, an ON-current is increased, a leakage current is decreased, and sub threshold current characteristics are improved. Simultaneously, the first and second metal wiring layers react with their underlying conductive layers by the hydrogen passivation, so that metal alloy such as aluminum alloy is formed therebetween.

This prior art DRAM device will be explained later in detail.

In the above-described prior art method, however, if the capacitor dielectric layer is made of silicon nitride or silicon oxynitride which has a high ability to stop the diffusion of hydrogen atoms therethrough, the hydrogen atoms hardly reach the channel region of the cell transistor. As a result, the improvement of the drain current-to-gate voltage characteristics is insufficient. In order to further increase the amount of hydrogen atoms in the channel region of the cell transistor, if the time period of the hydrogen passivation is further increased, the aluminum of the first and second metal wiring layers is recrystallized to grow the grains thereof. As a result, aluminum hillocks are generated, so that the first and second metal wiring layers are short-circuited.

Note that, in order to enhance the hydrogen passivation, it has been suggested to use a high-pressure hydrogen gas (see JP-A-62-174947). This, however, makes the hydrogen passivation apparatus complex, which increases the manufacturing cost.

SUMMARY OF THE INVENTION

It is an object of the present invention to provide a method for manufacturing a semiconductor device capable of effectively carrying out hydrogen passivation without inviting short-circuits of metal wiring layers.

According to the present invention, in a method for manufacturing a semiconductor device, a first insulating layer is formed on a semiconductor substrate, and a gate electrode is formed on the first insulating layer. Then, a second insulating layer is formed over the gate electrode. The second insulating layer has a high ability to stop the diffusion of hydrogen atoms therethrough. Then, hydrogen passivation is performed upon an interface between the semiconductor substrate and the first insulating layer at a first temperature. Then, a metal wiring layer is formed over the insulating layer, and the metal wiring layer is heated at a second temperature lower than the first temperature.

BRIEF DESCRIPTION OF THE DRAWINGS

The present invention will be more clearly understood from the description set for below, as compared with the prior art, with reference to the accompanying drawings, wherein.

DESCRIPTION OF THE PREFERRED EMBODIMENTS

Before the description of the preferred embodiments, a prior art method for manufacturing a DRAM device will be explained with reference to FIGS. 1A, 1B, 1C and 1D.

Figure 1A:
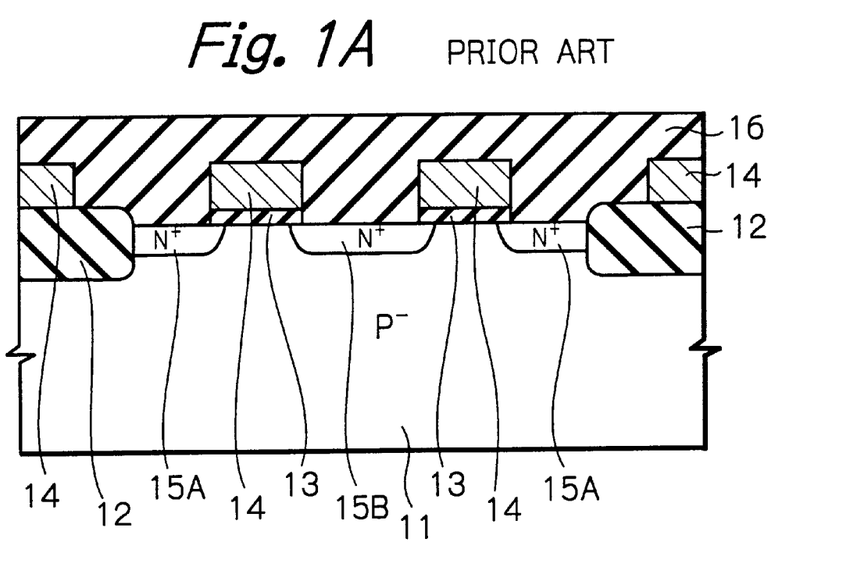
FIGS. 1A, 1B, 1C and 1D are cross-sectional views illustrating a prior art method for manufacturing a DRAM device.

Firstly, referring to FIG. 1A, a P-type monocrystalline silicon substrate 11 is thermally oxidized by using a local oxidation of silicon (LOCOS) process to grow a field silicon oxide layer 12. Then, the silicon substrate 11 is thermally oxidized to grow a gate silicon oxide layer 13. Then, a tungsten polycide layer is deposited by a chemical vapor deposition (CVD) process, and is patterned by a photolithography and etching process to form word lines or gate electrodes 14. Then, the gate silicon oxide layer 13 is etched in self-alignment with the gate electrodes 14, to expose sour/drain areas of the silicon substrate 11. Then, $N^+$-type impurity regions 15A and 15B are formed within the silicon substrate 11 in self-alignment with the gate electrodes 14 by an ion implantation of arsenic ions or phosphorus ions. Then, an insulating layer 16 made of silicon oxide or the like is formed by a CVD process on the entire surface. Note that a bit line (not shown) made of tungsten or the like is formed within the insulating layer 16 and is electrically connected to the impurity region 15B. Thus MOS transistors which serve as transfer gate transistors of memory cells are completed.

Figure 1B:
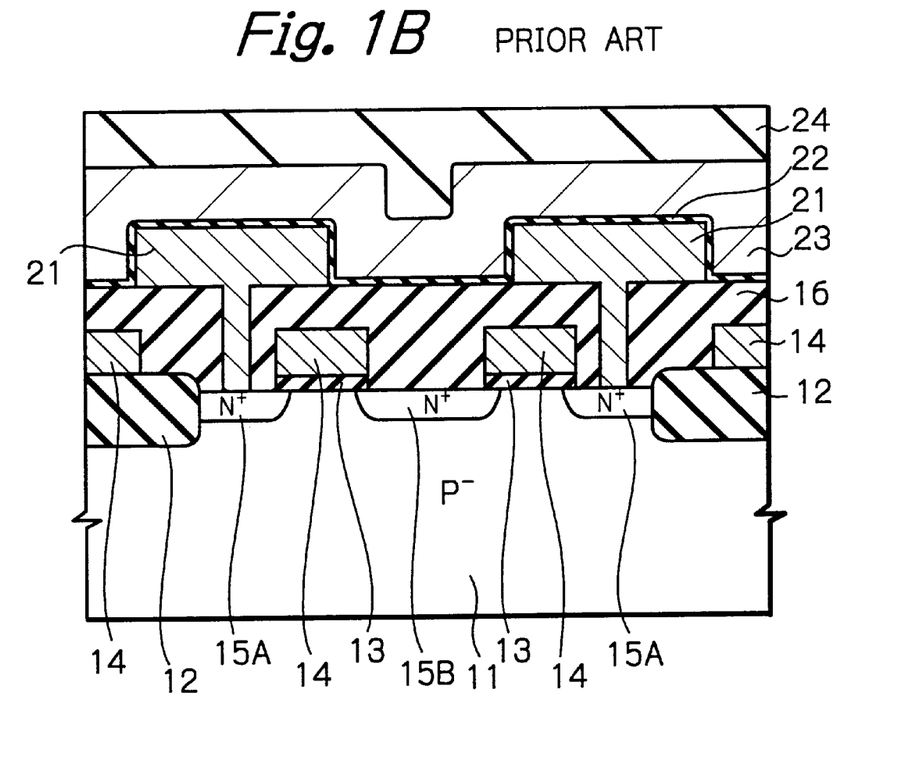

Next, referring to FIG. 1B, contact holes are perforated in the insulating layer 16 by a photolithography and etching process. Then, a phosphorus-doped polycrystalline silicon layer is deposited by a CVD process on the entire surface and is patterned by a photolithography and etching process to form cylindrical capacitor lower electrodes 21. Then, an about 5 nm thick capacitor dielectric layer 22 made of silicon nitride is deposited by a CVD process at about 800° C. on the capacitor lower electrodes 21. Then, a capacitor upper electrode (plate electrode) 23 made of phosphorus-including polycrystalline silicon or tungsten polycide is formed by a CVD process or a sputtering process on the capacitor dielectric layer 22. If the capacitor upper electrode 24 is made of tungsten polycide, a heating process at temperature of about 600° C. is carried out for siliciding of tungsten. Then, an insulating layer 24 made of silicon oxide or the like is formed by a plasma CVD process on the entire surface. Thus, capacitors of the memory cells are completed.

Note that contact holes (not shown) are perforated in the insulating layer 24 and phosphorus ions are implanted thereinto. Then, plugs not shown made of titanium, titanium nitride or tungsten are buried in the contact holes.

Figure 1C:
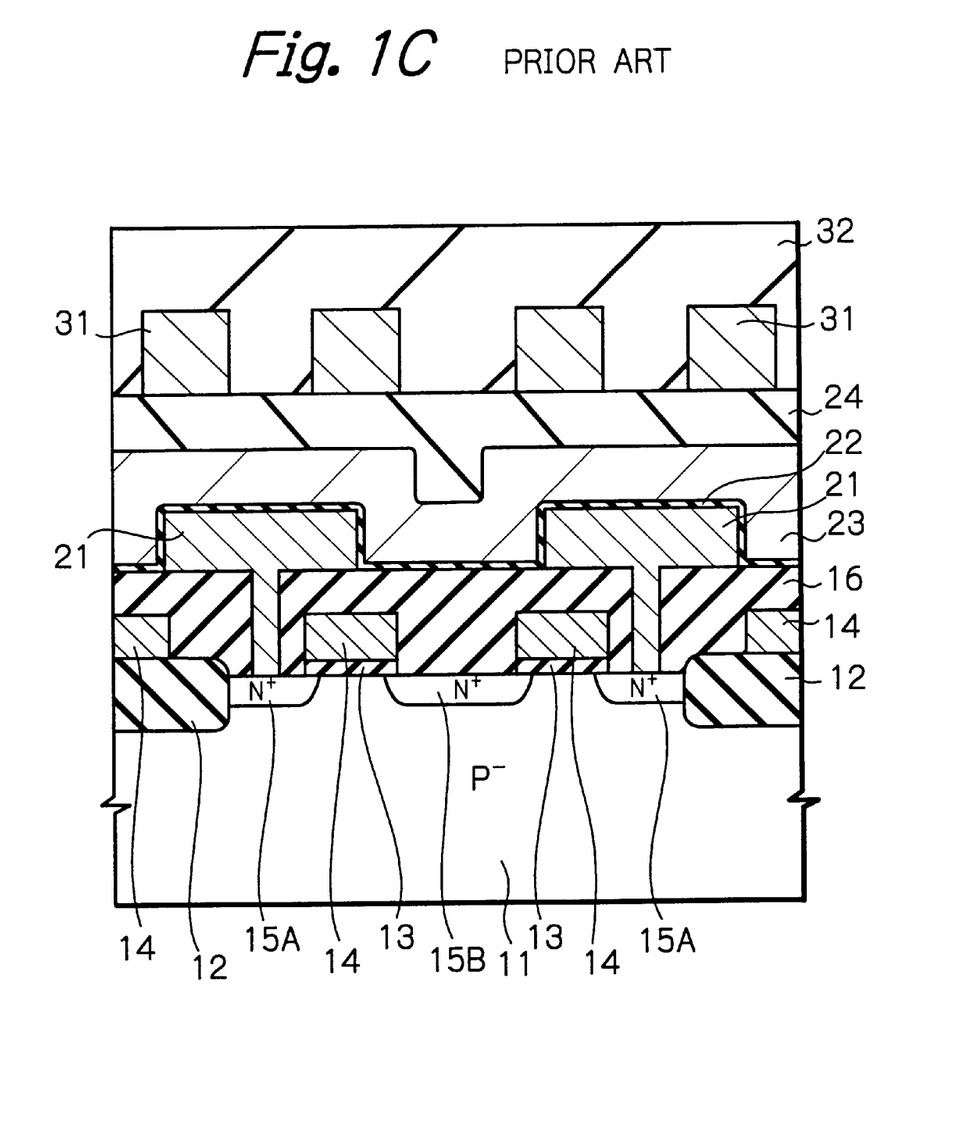

Next, referring to FIG. 1C, an about 400 nm thick metal wiring layer 31 made of aluminum or tungsten is deposited by a sputtering process on the insulating layer 24 and is patterned by a photolithography and dry etching process. Then, an insulating layer 32 made of silicon oxide or the like is deposited by a CVD process on the metal wiring layer 31.

Figure 1D:
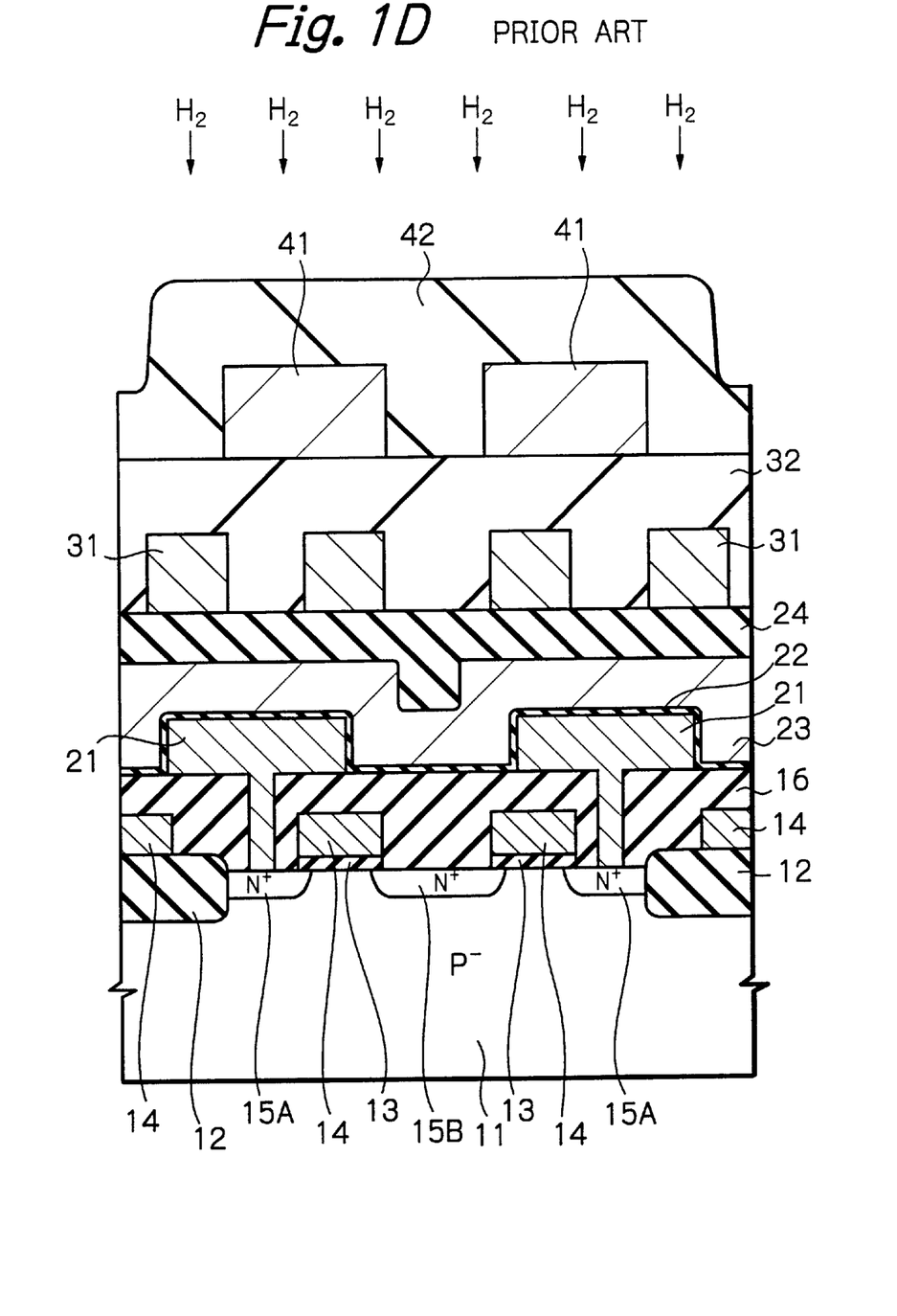

Finally, referring to FIG. 1D, an about 1 μm thick metal wiring layer 41 made of aluminum is deposited by a sputtering process on the insulating layer 32 and is patterned by a photolithography and dry etching process. Then, a passivation layer 42 made of silicon oxynitride or the like is deposited by a CVD process on the metal wiring layer 41.

Next, a hydrogen passivation is carried out at a temperature of about 400 to 450° C. for about 10 or more hours. That is, hydrogen atoms diffuse and reach the channel regions of the MOS transistors, so that unsaturated silicon atoms react with hydrogen atoms. This is called a hydrogen termination process. Thus, the drain current-to-gate voltage characteristics are improved. That is, an ON-current is increased, a leakage current is decreased, and sub threshold current characteristics are improved. Simultaneously, the metal wiring layers 31 and 41 react with their underlying conductive layers or the impurity diffusion regions 15B by the hydrogen passivation, so that metal alloy such as aluminum alloy is formed therebetween.

In the prior art method as shown in FIGS. 1A, 1B, 1C and 1D, however, since the capacitor dielectric layer 22 made of silicon nitride has a high ability to stop the diffusion of hydrogen atoms therethrough, the hydrogen atoms hardly reach the channel regions of the MOS transistors. As a result, the improvement of the drain current-to-gate voltage characteristics is insufficient. In order to further increase the amount of hydrogen atoms in the channel regions of the MOS transistors, if the time period of the hydrogen passivation is further increased, the aluminum of the metal wiring layers 31 and 41 is recrystallized to grow the grains thereof. As a result, aluminum hillocks are generated, so that the metal wiring layers 31 and 41 are short-circuited.

FIGS. 2A through 2D are cross-sectional views illustrating a first embodiment of the method for manufacturing a DRAM device according to the present invention.

Figure 2A:
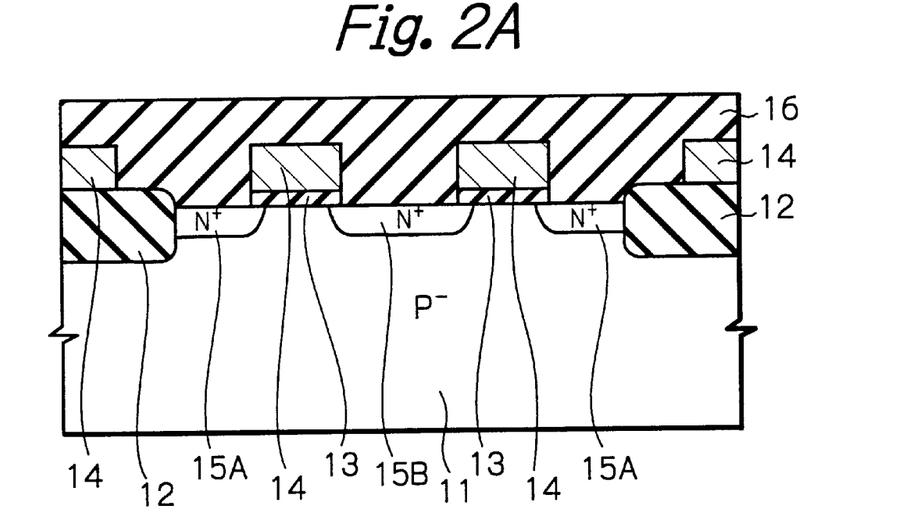
FIGS. 2A, 2B, 2C and 2D are cross-sectional views illustrating a first embodiment of the method for manufacturing a DRAM device according to the present invention.

Firstly, referring to FIG. 2A, in the same way as in FIG. 1A, a P⁻-type monocrystalline silicon substrate 11 is thermally oxidized by using a LOCOS process to grow a field silicon oxide layer 12. Then, the silicon substrate 11 is thermally oxidized to grow a gate silicon oxide layer 13. Then, a tungsten polycide layer is deposited by a CVD process, and is patterned by a photolithography and etching process to form word lines or gate electrodes 14. Then, the gate silicon oxide layer 13 is etched in self-alignment with the gate electrodes 14, to expose source/drain areas of the silicon substrate 11. Then, N⁺-type impurity regions 15A and 15B are formed within the silicon substrate 11 in self-alignment with the gate electrodes 14 by an ion implantation of arsenic ions or phosphorus ions. Then, an insulating layer 16 made of silicon oxide or the like is formed by a CVD process on the entire surface. Note that a bit line (not shown) made of tungsten or the like is formed within the insulating layer 16 and is electrically connected to the impurity region 15B. Thus MOS transistors which serve as transfer gate transistors of memory cells are completed.

Figure 2B:
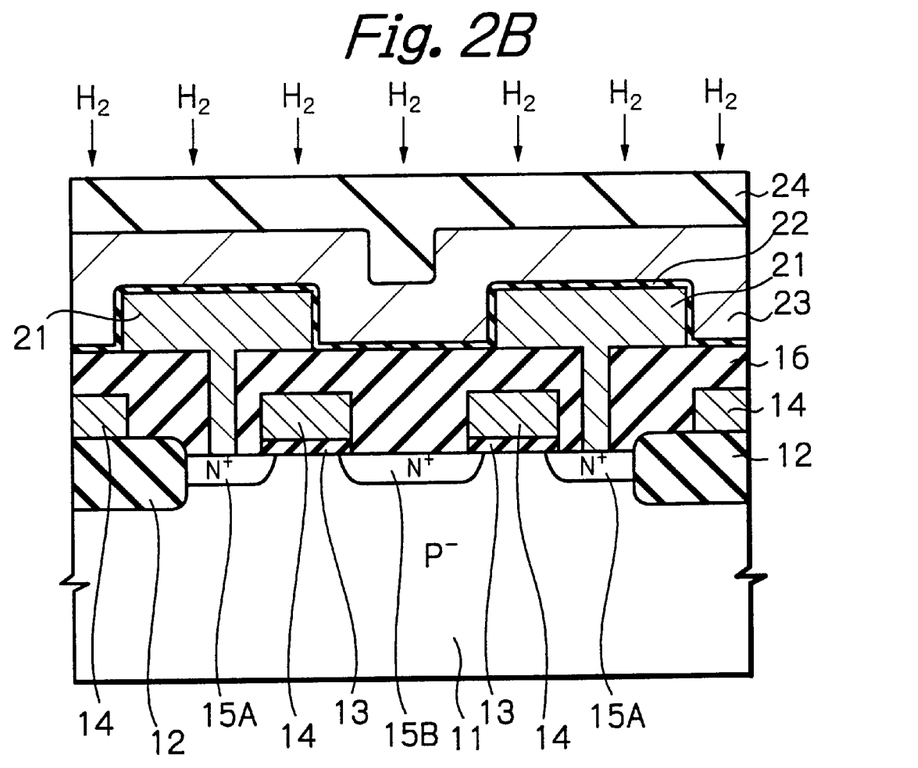

Next, referring to FIG. 2B, in a similar way to that of FIG. 1B, contact holes are perforated in the insulating layer 16 by a photolithography and etching process. Then, a phosphorus-doped polycrystalline silicon layer is deposited by a CVD process on the entire surface and is patterned by a photolithography and etching process to form cylindrical capacitor lower electrodes 21. Then, an about 5 nm thick capacitor dielectric layer 22 made of silicon nitride is deposited by a CVD process at about 800° C. on the capacitor lower electrodes 21. Then, a capacitor upper electrode (plate electrode) 23 made of phosphorus-including polycrystalline silicon or tungsten polycide is formed by a CVD process or a sputtering process on the capacitor dielectric layer 22. If the capacitor upper electrode 23 is made of tungsten polycide, a heating process at temperature of about 600° C. is carried out for siliciding of tungsten. Further, a chemical mechanical polishing (CMP) process is performed upon the insulating layer 24. Then, an insulating layer 24 made of silicon oxide or the like is formed by a plasma CVD process on the entire surface. Thus, capacitors of the memory cells are completed.

Note that contact holes (not shown) are perforated in the insulating layer 24 and phosphorus ions are implanted thereinto. Then, plugs not shown made of refractory metal such as titanium, titanium nitride or tungsten are buried in the contact holes.

Next, a hydrogen passivation is carried out at a temperature of about 450 to 500° C. for about 30 minutes. In this case, since the temperature of the hydrogen passivation is higher than that of the prior art, hydrogen atoms can easily diffuse and reach the channel regions of the MOS transistors through the capacitor dielectric layer 22, so that unsaturated silicon atoms react with hydrogen atoms. Thus, the drain current-to-gate voltage characteristics can be remarkably improved.

Figure 2C:
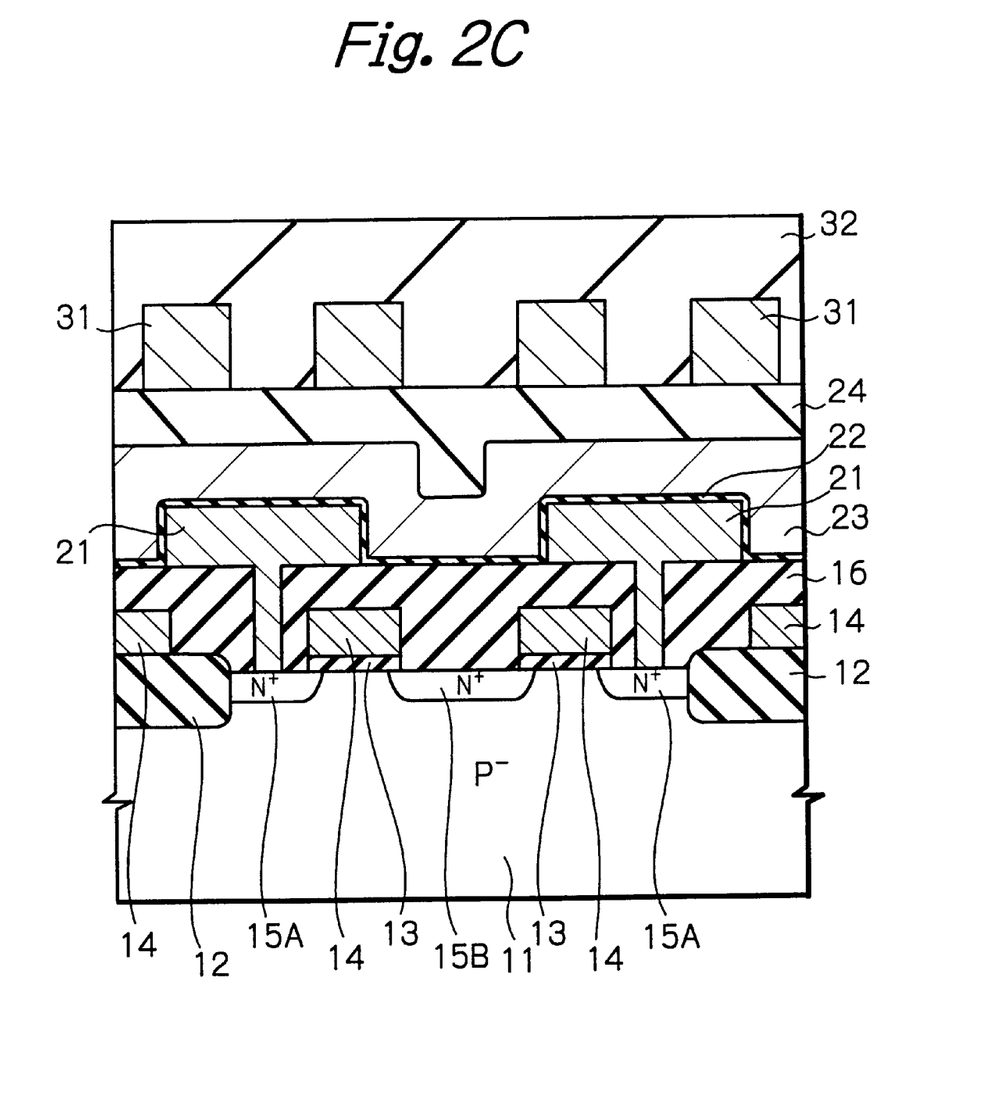

Next, referring to FIG. 2C, in a similar way to that in FIG. 1C, an about 400 nm thick metal wiring layer 31 made of aluminum or refractory metal such as tungsten is deposited by a sputtering process on the insulating layer 24 and is patterned by a photolithography and dry etching process. Then, an insulating layer 32 made of silicon oxide or the like is deposited by a plasma CVD process on the metal wiring layer 31. In this case, the temperature of the plasma CVD process is lower than the temperature of the hydrogen passivation. For example, the temperature of the plasma CVD process is about 350 to 400° C. Note that the insulating layer 32 can be formed by a spin on glass (SOG) solution coating method.

Next, contact holes (not shown) are perforated in the insulating layer 32, and then, phosphorus ions are implanted thereinto. Then, plugs (not shown) made of refractory metal such as titanium, titanium nitride or tungsten are buried in the contact holes.

Figure 2D:
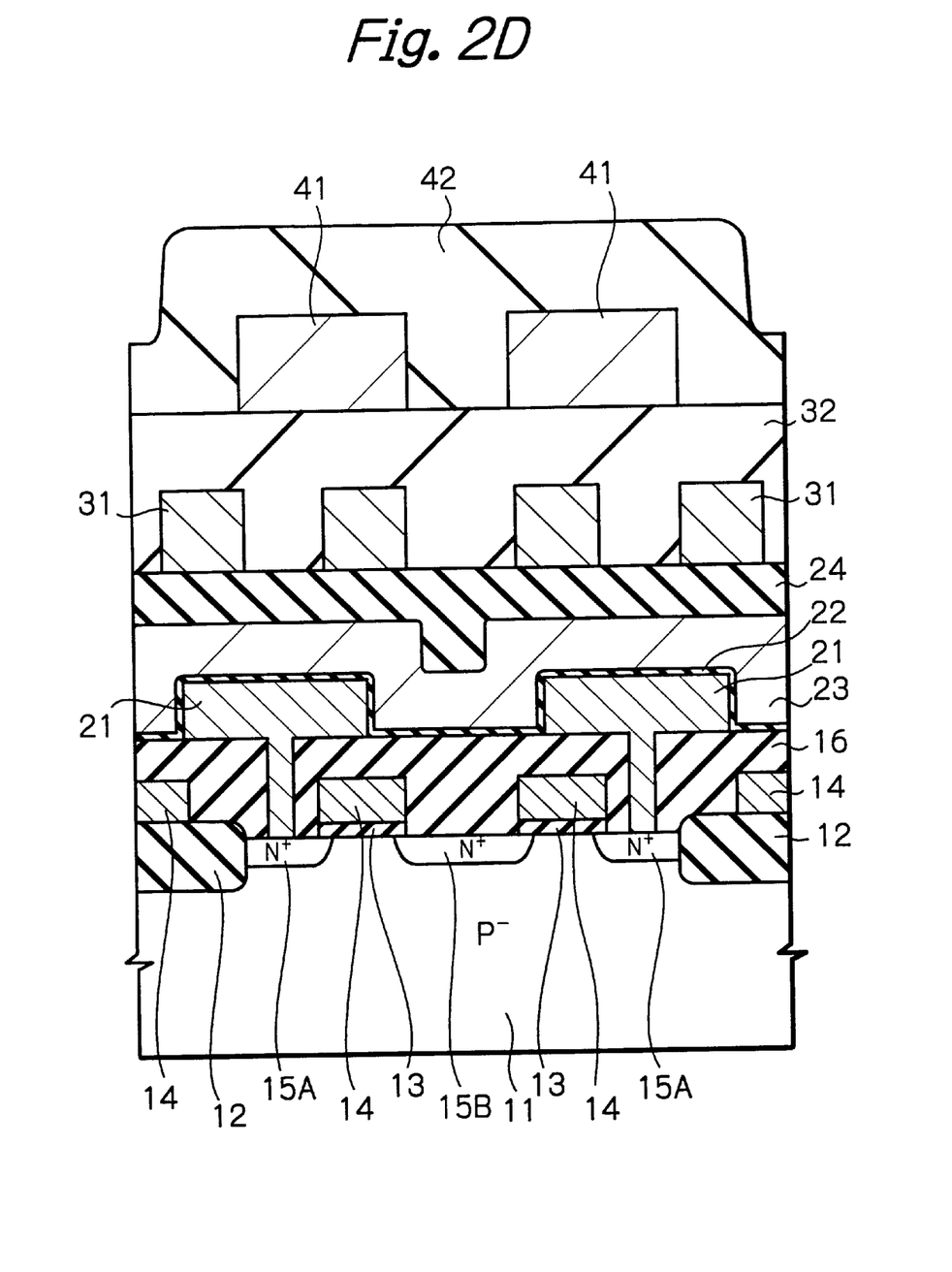

Finally, referring to FIG. 2D, in the same way as in FIG. 1D, an about 1 μm thick metal wiring layer 41 made of aluminum is deposited by a sputtering process on the insulating layer 32 and is patterned by a photolithography and dry etching process. Then, a passivation layer 42 made of silicon oxynitride or the like is deposited by a plasma CVD process on the metal wiring layer 41. In this case, the temperature of the plasma CVD process is lower than the temperature of the hydrogen passivation. For example, the temperature CVD process is about 350 to 400° C.

In the first embodiment as shown in FIGS. 2A, 2B, 2C and 2D, the metal wiring layers 31 and 41 react with their underlying conductive layers including the above-mentioned plugs or the impurity diffusion regions 15B by the high temperature of the plasma CVD process, so that metal alloy such as aluminum alloy is formed therebetween.

Also, in the first embodiment as shown in FIGS. 2A, 2B, 2C and 2D, even if the capacitor dielectric layer 22 made of silicon nitride has a high ability to stop the diffusion of hydrogen atoms therethrough, the hydrogen atoms easily reach the channel regions of the MOS transistors. In addition, since the temperature after the hydrogen passivation is made lower than the temperature of the hydrogen passivation, the dissociation of hydrogen atoms from the $Si/SiO_2$ interface can be suppressed. Therefore, the improvement of the drain current-to-gate voltage characteristics is excellent. Further, since the hydrogen passivation at a high temperature is carried out before the formation of the metal wiring layers 31 and 41, the aluminum of the metal wiring layers 31 and 41 is hardly recrystallized. As a result, aluminum hillocks are hardly generated, so that the metal wiring layers 31 and 41 are hardly short-circuited.

FIGS. 3A through 3D are cross-sectional views illustrating a second embodiment of the method for manufacturing a DRAM device according to the present invention.

Figure 3A:
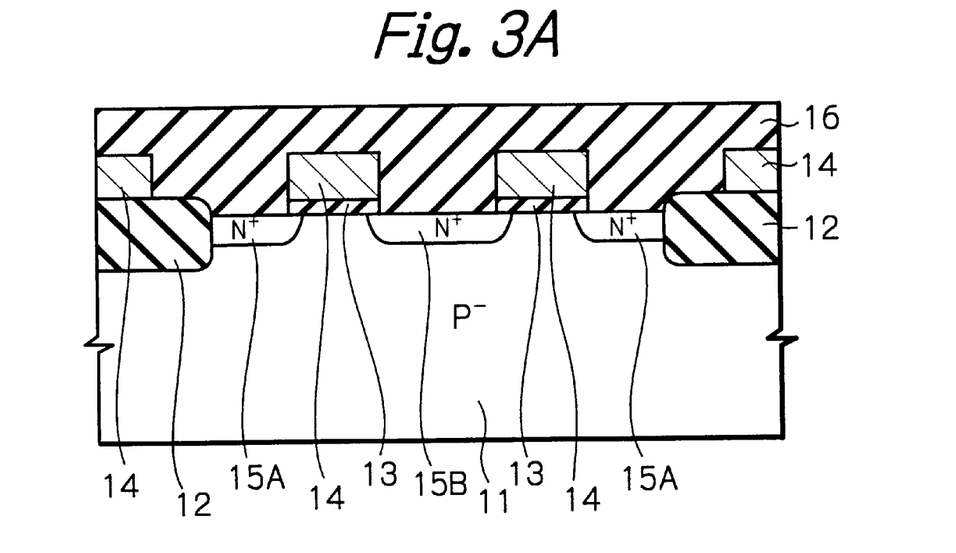
FIGS. 3A, 3B, 3C and 3D are cross-sectional views illustrating a second embodiment of the method for manufacturing a DRAM device according to the present invention.

Firstly, referring to FIG. 3A, in the same way as in FIG. 1A, a $P^-$-type monocrystalline silicon substrate 11 is thermally oxidized by using a LOCOS process to grow a field silicon oxide layer 12. Then, the silicon substrate 11 is thermally oxidized to grow a gate silicon oxide layer 13. Then, a tungsten polycide layer is deposited by a CVD process, and is patterned by a photolithography and etching process to form word lines or gate electrodes 14. Then, the gate silicon oxide layer 13 is etched in self-alignment with the gate electrodes 14, to expose source/drain areas of the silicon substrate 11. Then, $N^+$-type impurity regions 15A and 15B are formed within the silicon substrate 11 in self-alignment with the gate electrodes 14 by an ion implantation of arsenic ions or phosphorus ions. Then, an insulating layer 16 made of silicon oxide or the like is formed by a CVD process on the entire surface. Note that a bit line (not shown) made of tungsten or the like is formed within the insulating layer 16 and is electrically connected to the impurity region 15B. Thus, MOS transistors which serve as transfer gate transistors of memory cells are completed.

Figure 3B:
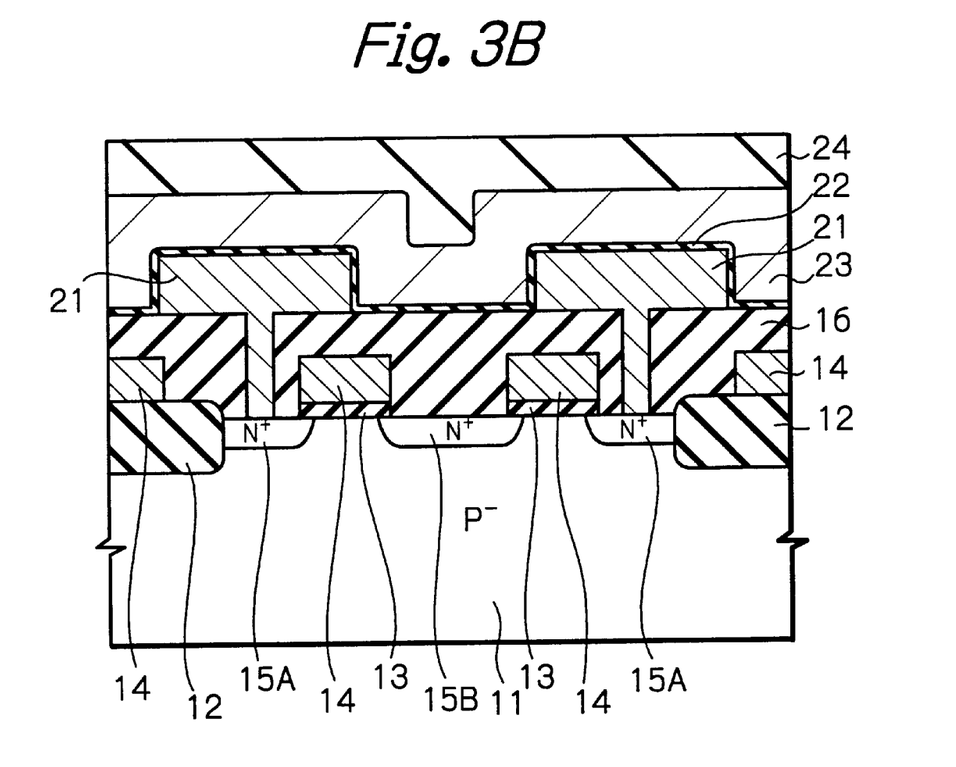

Next, referring to FIG. 3B, in the same way as in FIG. 1B, contact holes are perforated in the insulating layer 16 by a photolithography and etching process. Then, a phosphorus-doped polycrystalline silicon layer is deposited by a CVD process on the entire surface and is patterned by a photolithography and etching process to form cylindrical capacitor lower electrodes 21. Then, an about 5 nm thick capacitor dielectric layer 22 made of silicon nitride is deposited by a CVD process at an about 800° C. on the capacitor lower electrodes 21. Then, a capacitor upper electrode (plate electrode) 23 made of phosphorus-including polycrystalline silicon or tungsten polycide is formed by a CVD process or a sputtering process on the capacitor dielectric layer 22. If the capacitor upper electrode 23 is made of tungsten polycide, a heating process at about 600° C. is carried out for siliciding of tungsten. Then, an insulating layer 24 made of silicon oxide or the like is formed by a plasma CVD process on the entire surface. Further, a CMP process is performed upon the insulating layer 24. Thus, capacitors of the memory cells are completed.

Note that contact holes (not shown) are perforated in the insulating layer 24 and phosphorus ions are implanted thereinto. Then, plugs not shown made of refectory metal such as titanium, titanium nitride or tungsten are buried in the contact holes.

Figure 3C:
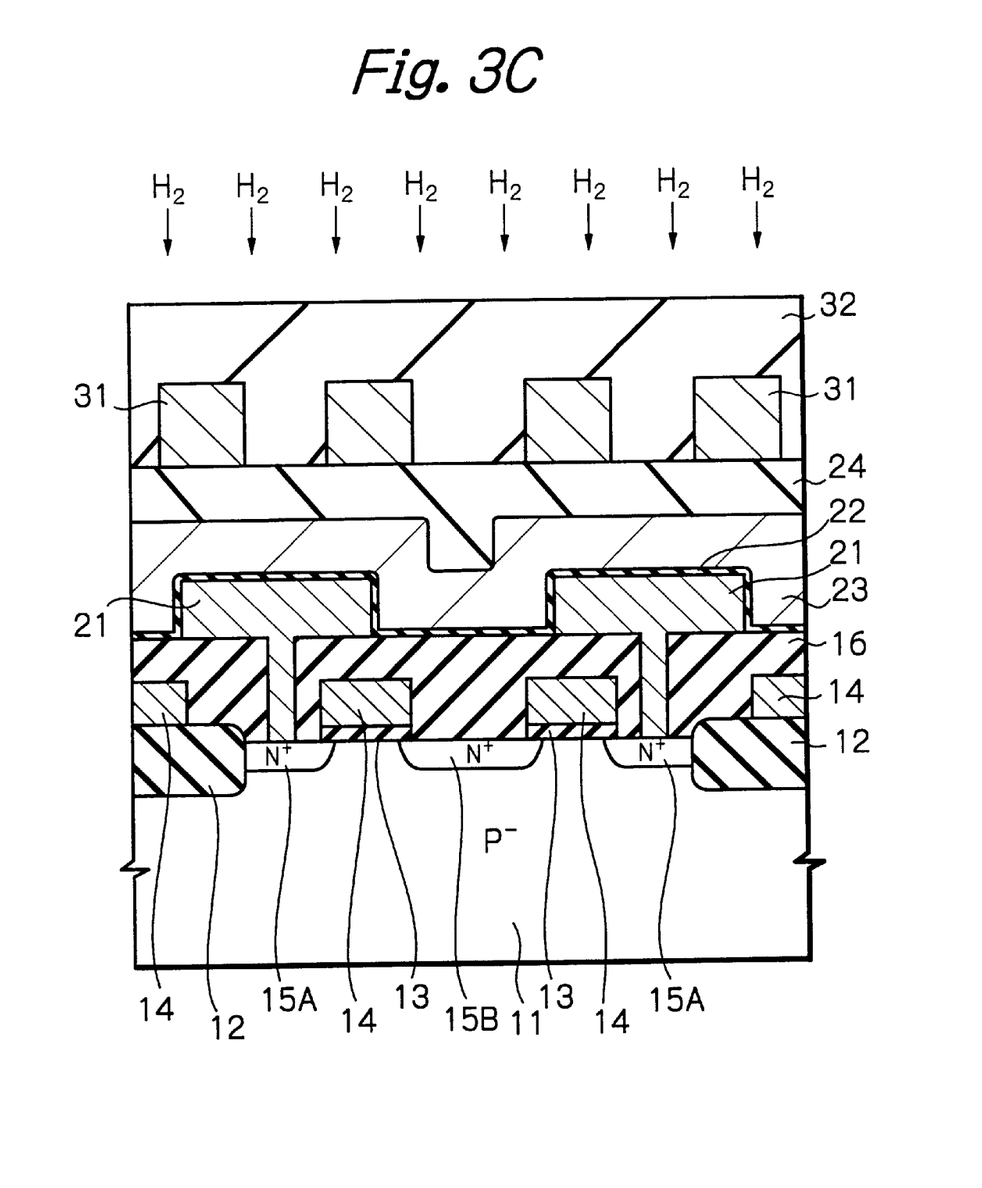

Next, referring to FIG. 3C, in a similar way to that in FIG. 1C, an about 400 nm thick metal wiring layer 31 made of aluminum or refractory metal such as tungsten is deposited by a sputtering process on the insulating layer 24 and is patterned by a photolithography and dry etching process. Then, an insulating layer 32 made of silicon oxide or the like is deposited by a plasma CVD process on the metal wiring layer 31. Note that the insulating layer 32 can be formed by a spin on glass (SOG) solution coating method.

Next, a hydrogen passivation is carried out at a temperature of about 400° C. for about 1 to 2 hours. That is, the time period of the hydrogen passivation is longer than that of the first embodiment, since the temperature of the hydrogen passivation is lower than that of the first embodiment. In this case, since the metal wiring layer 41 is not provided yet, hydrogen atoms can easily diffuse and reach the channel regions of the MOS transistors through the capacitor dielectric layer 22, so that unsaturated silicon atoms react with hydrogen atoms. Thus, the drain current-to-gate voltage characteristics can be remarkably improved.

Next, contact holes (not shown) are perforated in the insulating layer 32, and phosphorus ions are implanted thereinto. Then, plugs (not shown) made of refractory metal such as titanium nitride or tungsten are buried in the contact holes.

Figure 3D:
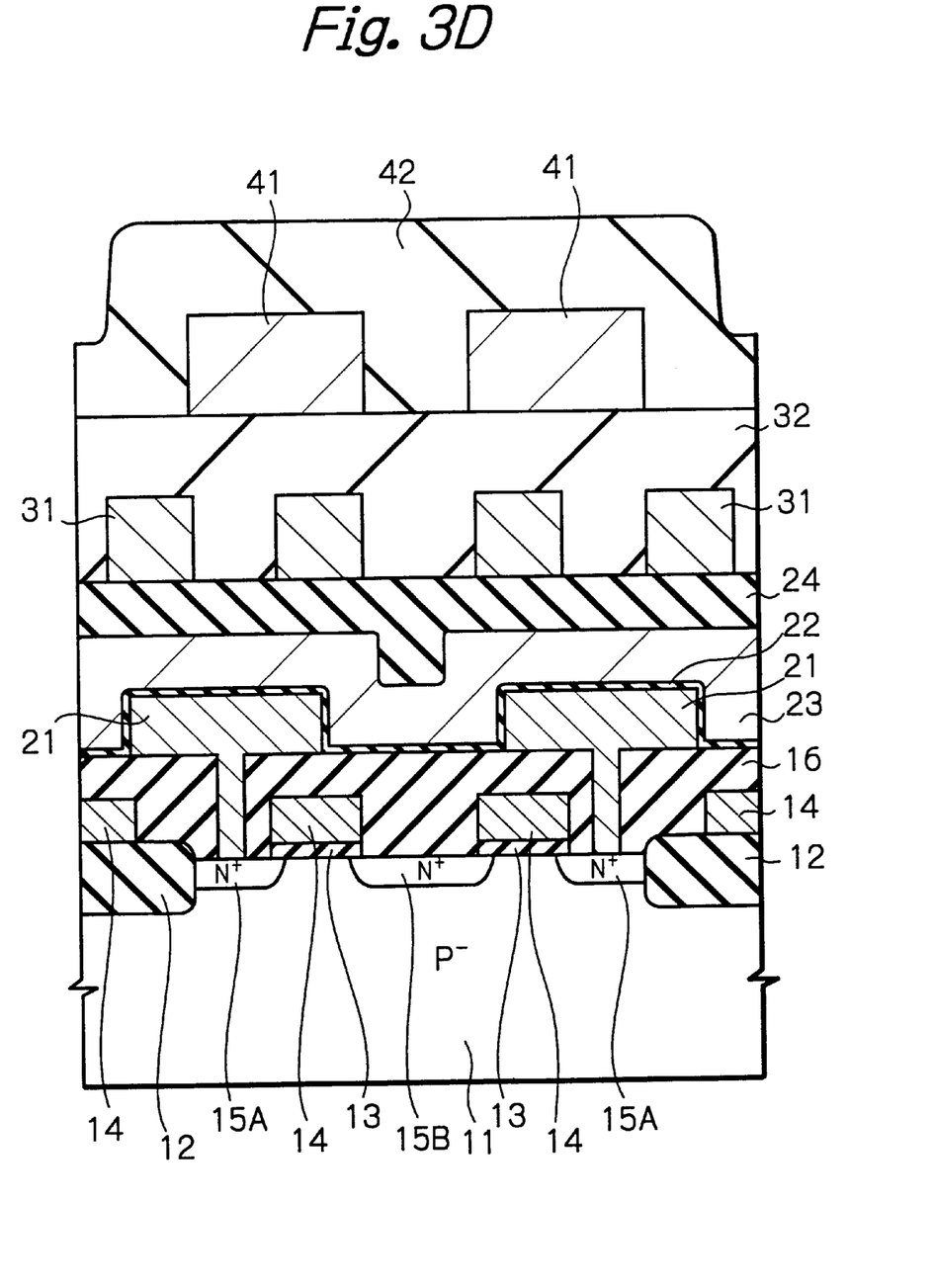

Finally, referring to FIG. 3D, in the same way as in FIG. 1D, an about 1 $\mu$m thick metal wiring layer 41 made of aluminum is deposited by a sputtering process on the insulating layer 32 and is patterned by a photolithography and dry etching process. Then, a passivation layer 42 made of silicon oxynitride or the like is deposited by a plasma CVD process on the metal wiring layer 41. In this case, the temperature of the plasma CVD process is lower than the temperature of the hydrogen passivation. For example, the temperature of the plasma CVD process is about 350° C.

In the second embodiment as shown in FIGS. 3A, 3B, 3C and 3D, the metal wiring layer 31 reacts with its underlying conductive layer including the above-mentioned plugs or the impurity diffusion regions 15B by the high temperature of the hydrogen passivation, so that metal alloy such as aluminum alloy is formed therebetween. Also, the metal wiring layer 41 reacts with its underlying conductive layer including the above-mentioned plugs or the impurity diffusion regions 15B by the high temperature of the plasma CVD process, so that metal alloy such as aluminum alloy is formed therebetween.

Also, in the second embodiment as shown in FIGS. 3A, 3B, 3C and 3D, even if the capacitor dielectric layer 22 made of silicon nitride has a high ability to stop the diffusion of hydrogen atoms therethrough, the hydrogen atoms easily reach the channel regions of the MOS transistors. In addition, since the temperature after the hydrogen passivation is made lower than the temperature of the hydrogen passivation, the dissociation of hydrogen atoms from the $Si/SiO_2$ interface can be suppressed. Therefore, the improvement of the drain current-to-gate voltage characteristics is excellent. Further, since the hydrogen passivation at a high temperature is carried out before the formation of the metal wiring layer 41, the aluminum of the metal wiring layer 41 is hardly recrystallized. Note that the aluminum of the metal wiring layer 31 is also hardly recrystallized, since the temperature of the hydrogen passivation is relatively low. As a result, aluminum hillocks are hardly generated, so that the metal wiring layers 31 and 41 are hardly short-circuited.

In the above-described embodiments, although the capacitor dielectric layer 22 is made of silicon nitride, the present invention can be applied to a capacitor dielectric layer made of silicon oxynitride which also has a high ability to stop the diffusion of hydrogen atoms therethrough.

Also, the present invention can be applied to semiconductor devices other than the DRAM devices.

As explained hereinabove, according to the present invention, since the hydrogen passivation is effectively carried out, the drain current-to-gate voltage characteristics can be remarkably improved even if an insulating layer having a high ability to stop the diffusion of hydrogen atoms therethrough. In addition, since hydrogen passivation at a high temperature is carried out before the formation of metal wiring layers, the growth of aluminum hillocks in the metal wiring layers can be suppressed, thus avoiding short-circuit.

What is claimed is:

1. A method for manufacturing a semiconductor device, comprising:

thermally growing a first insulating layer made of silicon oxide on a silicon substrate;

forming a gate electrode on said first insulating layer;

forming a second insulating layer on said gate electrode;

forming a capacitor lower electrode on said second insulating layer;

forming a capacitor dielectric layer on said capacitor lower electrode;

forming a capacitor upper electrode on said capacitor dielectric layer;

forming a third insulating layer on said capacitor dielectric layer;

carrying out hydrogen passivation at a first temperature after said third insulating layer is formed;

forming a first metal wiring layer on said third insulating layer after said hydrogen passivation is carried out;

forming a fourth insulating layer on said it metal layer at a second temperature lower than said first temperature;

forming a second metal wiring layer on said fourth insulating layer; and forming a passivation layer on said second metal layer at a third temperature lower than said first temperature.

2. The method as set forth in claim 1, wherein said capacitor dielectric layer is made of one of silicon nitride and silicon oxynitride.

3. The method as set forth in claim 1, wherein said second third and fourth insulating layers are made of silicon oxide.

4. The method as set forth in claim 1, wherein said forming of said fourth insulating layer comprises forming said fourth insulating layer by a plasma chemical vapor deposition process at said second temperature.

5. The method as set forth in claim 1, wherein said forming of said passivation layer comprises forming said passivation layer by a plasma chemical vapor deposition process at said third temperature.

6. A method for manufacturing a semiconductor device, comprising:

thermally growing a first insulating layer made of silicon oxide on a silicon substrate;

forming a gate electrode on said first insulating layer;

forming a second insulating layer on said gate electrode;

forming a capacitor lower electrode on said second insulating layer;

forming a capacitor dielectric layer on said capacitor lower electrode;

forming a capacitor upper electrode on said capacitor dielectric layer;

forming a third insulating layer on said capacitor dielectric layer;

forming a first metal wiring layer on said third insulating layer;

forming a fourth insulating layer on said first metal layer at a first temperature;

carrying out hydrogen passivation at a second temperature a said fourth insulating layer is formed;

forming a second metal wiring layer on said fourth insulating layer after said hydrogen passivation is carried out; and forming a passivation layer on said second metal layer at a third temperature lower than said second temperature.

7. The method as set forth in claim 6, wherein said capacitor dielectric layer is made of one of silicon nitride and silicon oxynitride.

8. The method as set forth in claim 6, wherein said second third and fourth insulating layers are made of silicon oxide.

9. The method as set forth in claim 6, wherein said fourth insulating layer forming comprises forming said fourth insulating layer by a plasma chemical vapor deposition process at said first temperature.

10. The method as set forth in claim 6, wherein said forming of said passivation layer comprises forming said passivation layer, by a plasma chemical vapor deposition process at said third temperature.

* * * * *